(12) United States Patent
Bhadare et al.

(10) Patent No.: US 7,151,269 B2
(45) Date of Patent: Dec. 19, 2006

(54) SAMPLE INSPECTION APPARATUS

(75) Inventors: Santokh Singh Bhadare, Middlesex (GB); Ian Richard Barkshire, Cambs (GB); Daniel Frank Turner, Bucks (GB)

(73) Assignee: Oxford Instruments Analytical Ltd., Oxford (GB)

( * ) Notice: Subject to any disclaimer, the term of this patent is extended or adjusted under 35 U.S.C. 154(b) by 74 days.

(21) Appl. No.: 11/125,317

(22) Filed: May 10, 2005

(65) Prior Publication Data

US 2006/0255290 A1 Nov. 16, 2006

(51) Int. Cl.
*H01J 37/28* (2006.01)

(52) U.S. Cl. .............................. 250/440.11; 250/443.1; 250/310; 250/311; 250/397

(58) Field of Classification Search ................... None
See application file for complete search history.

(56) References Cited

U.S. PATENT DOCUMENTS 6,573,509 B1 * 6/2003 Radley et al. .............. 250/397

* cited by examiner

*Primary Examiner*—Nikita Wells

(57) ABSTRACT

A sample inspection apparatus comprises a sample support; a detection system for detecting radiation emitted by or transmitted through a sample on the sample support in response to radiation incident on the sample; and a cooling system for cooling at least one of the sample support and detection system. The cooling system includes at least one oscillating, mechanical component which oscillates at a frequency different from the at least one of the support and detection system.

18 Claims, 4 Drawing Sheets

Image obtained at default settings
(settings are frequencies for the fan and
compressor in the x-ray detector system)

Image obtained at optimum settings
(settings are frequencies for the fan and
compressor in the x-ray detector system)

US 7,151,269 B2

SAMPLE INSPECTION APPARATUS

FIELD OF THE INVENTION

The invention relates to sample inspection apparatus, for example microbeam instruments that can record images and excite X-rays from a sample.

DESCRIPTION OF THE PRIOR ART

Microbeam instruments that can record images and excite x-rays from a sample using an electron beam include scanning electron microscopes (SEMs), transmission electron microscopes (TEMs), scanning transmission electron microscopes (STEMs), electron probe microanalysers (EPMAs) and defect review tools (DRTs). Microbeam instruments are also available that use X-ray optical elements to focus an X-ray beam on a sample and these also now capable of forming images. Any imaging system is sensitive to vibration and when an X-ray detector is interfaced to a microbeam instrument, it is possible for vibration to be transferred to the instrument and adversely affect the quality of images obtained in the imaging mode of the instrument.

In a microbeam instrument, the incident beam of electrons, X-rays or ions is normally used to form a magnified image of the specimen, either by scanning a focussed beam over the sample in a raster fashion while monitoring a secondary signal or forming a transmission image below the specimen as in an X-ray microscope (XRM) for example. Other devices such as a scanning tunnelling microscope (STM) or other high resolution scanning probe microscope devices may also be interfaced to the microbeam instrument in order to acquire a high resolution image of the sample. Other methods may also be used to generate a magnified focussed image of the sample. When the microbeam instrument is acquiring such an image, any relative movement between the sample, beam generator or image detection system will produce distortion so the X-ray detection system must not induce any vibration during image acquisition. Furthermore, when a focussed beam is directed on to small particle in order to analyse the particle, it is important that the sample does not move away from the beam so vibrations must not affect the sample support stage.

Whereas X-ray detectors have often been cooled by a static reservoir of liquid nitrogen, in recent years there has been a shift in design to replace the liquid nitrogen reservoir by a cooling device that is powered by electricity. For example U.S. Pat. No. 6,573,509 describes a new type of mechanical pulse tube cooled lithium drifted Si (Si(Li)) detector. New types of detector require different types of cooling. Silicon drift detectors (SDD) may be cooled by Peltier stacks but fans or even closed cycle cooling water systems may be necessary to take the heat away from the hot side of the stack. Microcalorimeter detectors require much lower temperatures (see for example, "A Well Dressed Microscope: Practical Experience with Microcalorimeter and Silicon Drift Detector Systems", John Small et al, Microscopy and Microanalysis, Volume 8, Issue S02. August 2002. pp 82–83). Closed cycle cooling systems that do not require continual replenishment of cryogens such as liquid Helium may also introduce vibrations (see for example "The Latest Experiences Using A Cryogen Free Microcalorimeter Energy Dispersive X-Ray Spectrometer", Del Redfern et al, Microscopy and Microanalysis, Volume 8, Issue S02. August 2002. pp 80–81)

Whatever method of cooling is used, some vibration is normally produced. This may be caused for example by mechanical rotating parts, movements of pistons, pressure waves in gases in order to implement the thermodynamical changes responsible for cooling. In addition, vibration may be produced by fans and pumps used in auxiliary systems to take heat away from the main cooler. For example an electrical fan blowing on a heat sink or a closed cycle system where coolant is driven around a circuit by a pump.

Various techniques have been used to reduce the influence of vibration on the microbeam instrument. For example U.S. Pat. No. 6,242,748 describes a vibration damping system for use when an X-ray detecting unit is mounted on an electron microscope. U.S. Pat. No. 6,573,509 describes a system where the design is optimised to minimise the power required for cooling, an active vibration damping mechanism can be used and a lower power "standby" mode can be used to minimise vibration during the period when an image is being acquired from the instrument. While these techniques are helpful, at high magnification there may still be some residual effect on images from the microbeam instrument. It is very difficult to correct for these during use.

The use of cryogen-free coolers is desirable for many applications in conjunction with high-resolution low-temperature microscopy and a key requirement is performance with low vibration. In this case, the cooler is used to cool the sample rather than the X-ray detector transducer but the vibration issues are similar. If microscopes such as confocal optical microscopes or scanning probe microscopes (STM, AFM etc.) are used to study cold samples then the same principles described in the following invention could be applied to minimise the transfer of vibration from the cooling device. Furthermore, where ultra-low temperature refrigeration is required, for example for superconducting magnets used in NMR spectrometry or magnetic resonance imaging (MRI), vibration transferred from the cooler to the instrument may adversely affect performance.

SUMMARY OF THE INVENTION

In accordance with a first aspect of the present invention, a sample inspection apparatus comprises a sample support; a detection system for detecting radiation or particles emitted by or transmitted through a sample on the sample support in response to radiation incident on the sample; and a cooling system for cooling at least one of the sample support and detection system, the cooling system including at least one oscillating, mechanical component which oscillates at a frequency different from the or each resonant frequency of the at least one of the support and detection system.

Instead of, or as well as, trying to damp vibrations or reduce their effect as in the prior art, we ensure that the oscillating mechanical components of the cooling system oscillate at frequencies different from the resonant frequencies of the overall mechanical system. The size of the difference will depend on the "Q" of the resonance. For a sharp resonance, a few Hz different can be sufficient whereas if the resonance is damped, the response may extend over a larger range.

Thus, whereas all current techniques for interfacing to a microbeam instrument have concentrated on reducing the power required for cooling devices or attempting to dampen or cancel the vibrations, the invention takes account of the fact that the microbeam instrument, and in particular the stage used for holding samples for inspection, exhibits mechanical resonances at various frequencies.

The oscillating mechanical component may be a piston or other rotating component of a cryocooler and/or a cooling fan or pump used to enhance the action of the cryocooler. The invention applies to both closed and open cycle cooling systems.

Typical cooling systems are mechanical cryo-free refrigerators such as pulse tube, Gifford-McMahon refrigerators etc.

In some cases, the resonant frequencies can be determined during manufacture of the apparatus, the oscillating mechanical components then being permanently set to oscillate at different frequencies from the known resonances of the microbeam instrument for which the detector system is intended. However, since the resonant frequencies can vary during use, particularly in dependence upon the mass of the sample being inspected, preferably the apparatus further comprises a controller for controlling the frequency of oscillation of the at least one oscillating mechanical component.

In a particularly preferred aspect, the apparatus further comprises an imaging system for obtaining an image of a sample from radiation or particles detected by the detection system from different pixels of the sample; a comparator for comparing images, obtained using one or more oscillation frequencies, with an image obtained without oscillating the at least one mechanical component, and for determining which has the least distortion due to vibration effects; and a controller responsive to the comparator for subsequently controlling the frequency of oscillation of the at least one oscillating mechanical component in accordance with the frequency associated with the determined image.

Further, in accordance with a second aspect of the invention, a method of determining a suitable operating frequency of an oscillating mechanical component of a sample inspection apparatus comprises:

i) obtaining images of a sample from radiation or particles detected from different points of the sample using one or more oscillation frequencies;

ii) comparing the image(s) obtained with an image obtained without oscillating the at least one mechanical component and determining which has the least distortion due to vibration effects; and iii) subsequently controlling the frequency of oscillation of the at least one oscillating mechanical component in accordance with the frequency associated with the determined image.

This overcomes the problem that it is very difficult to sense the undesired vibrations using conventional sensors because they may be as small as 1 nm.

Typically, the at least one oscillating mechanical component is controlled to oscillate at substantially the same frequency as that used when obtaining the determined image.

BRIEF DESCRIPTION OF THE DRAWINGS

An example of a sample inspection apparatus according to the invention will now be described with reference to the accompanying drawings, in which:—

DESCRIPTION OF EMBODIMENT

Figure 1:
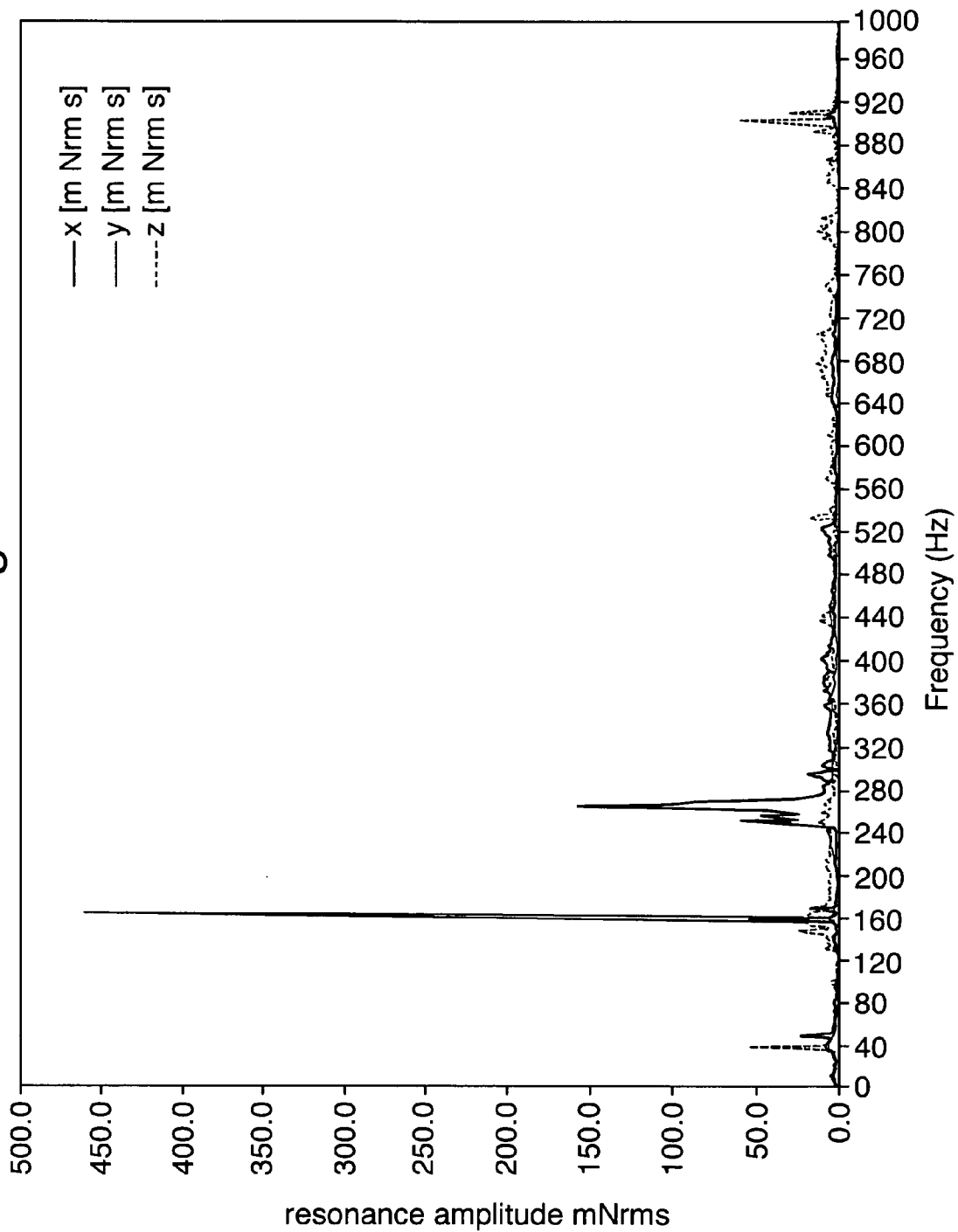
FIG. 1 illustrates a typical frequency response curve from a capacitance probe attached to the sample stage of a microbeam instrument with an X-ray detector, amplitude of oscillation being shown as a function of frequency of the vibration transducer attached to the detector interface.

FIG. 1 shows the amplitude response of a capacitance sensor mounted on a microbeam instrument with an X-ray detector as a function of the frequency of vibration transducer mounted on the chamber wall. The enhanced response at frequencies near 40,160 and 900 Hz in particular suggests the presence of mechanical resonances at these frequencies. If the X-ray detector system includes devices that oscillate at frequencies close to any of these resonances, then vibrations will be more effectively transferred from the X-ray detector to the microbeam instrument. If the X-ray detector system is designed so that the frequency of oscillation can be varied for each oscillating component, then the X-ray detector system can be tuned to minimise the effects of vibration on the microbeam instrument by avoiding such resonances.

Figure 2:
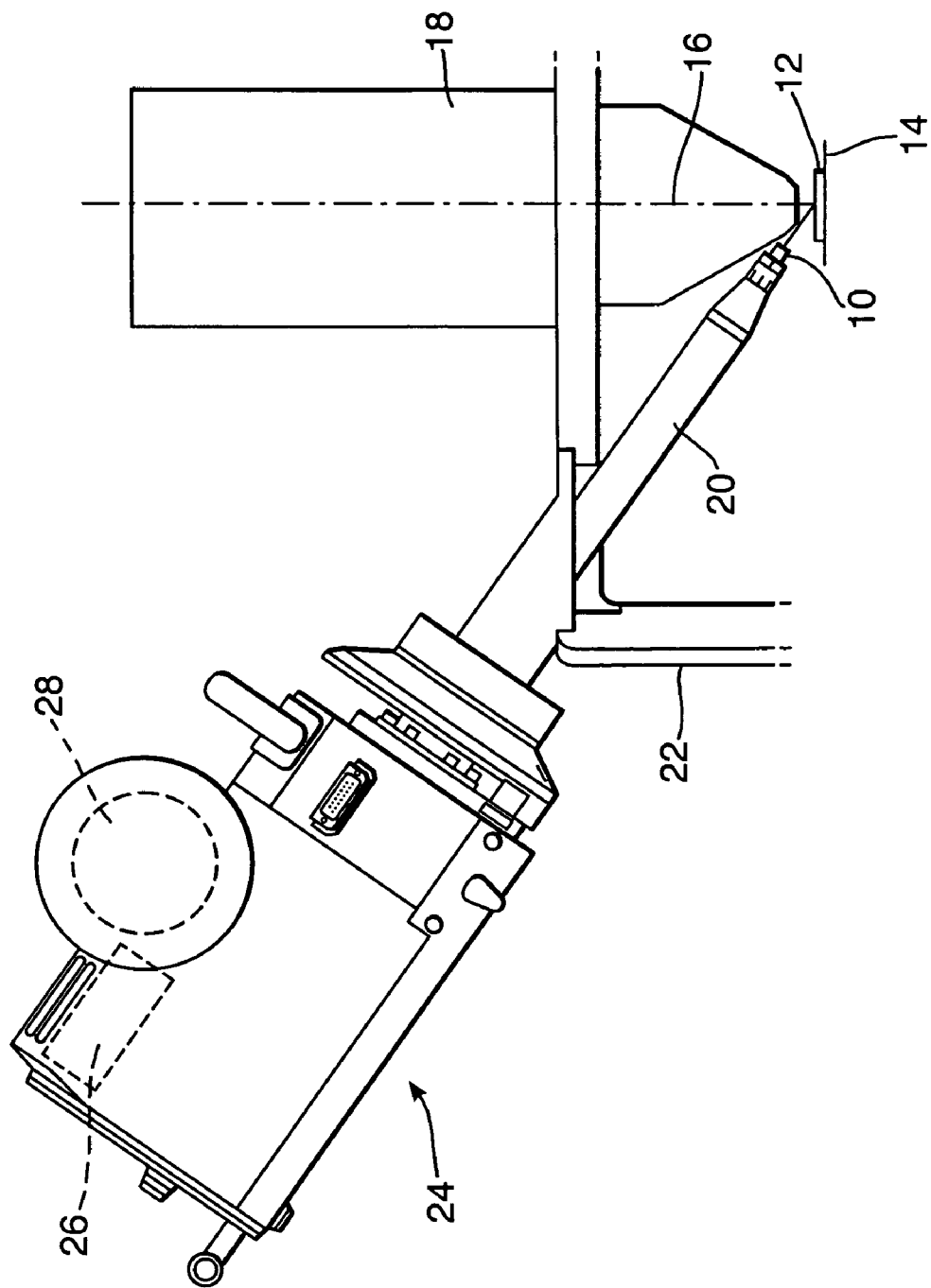
FIG. 2 is a schematic side view of a microbeam instrument.

An example of a microbeam instrument with an X-ray detector which is constructed according to the invention is shown in FIG. 2.

FIG. 2 illustrates a sample support 14 on which a sample 12 to be analysed is located. An electron beam 16 originating from a source (not shown) within a microbeam column 18 impinges on the sample 12 causing X-rays to be emitted. These X-rays are detected by an X-ray detector transducer 10.

Signals from the X-ray sensor 10 representing the intensity of received X-rays, usually on a pixel by pixel basis, are fed to a preamplifier 40 and from there to a microprocessor 42 for analysis and storage.

The X-ray detector transducer 10 is mounted on a cooling finger 20 extending through and supported by a housing 22 and connected to a mechanical, cryo-free cooler 24. The cooler 24 has a conventional construction which will not be described in detail but includes a fan 26 and a compressor 28, both of which oscillate and produce mechanical vibrations. Typical examples are pulse tube and Gifford-McMahon refrigerators.

Figure 3:
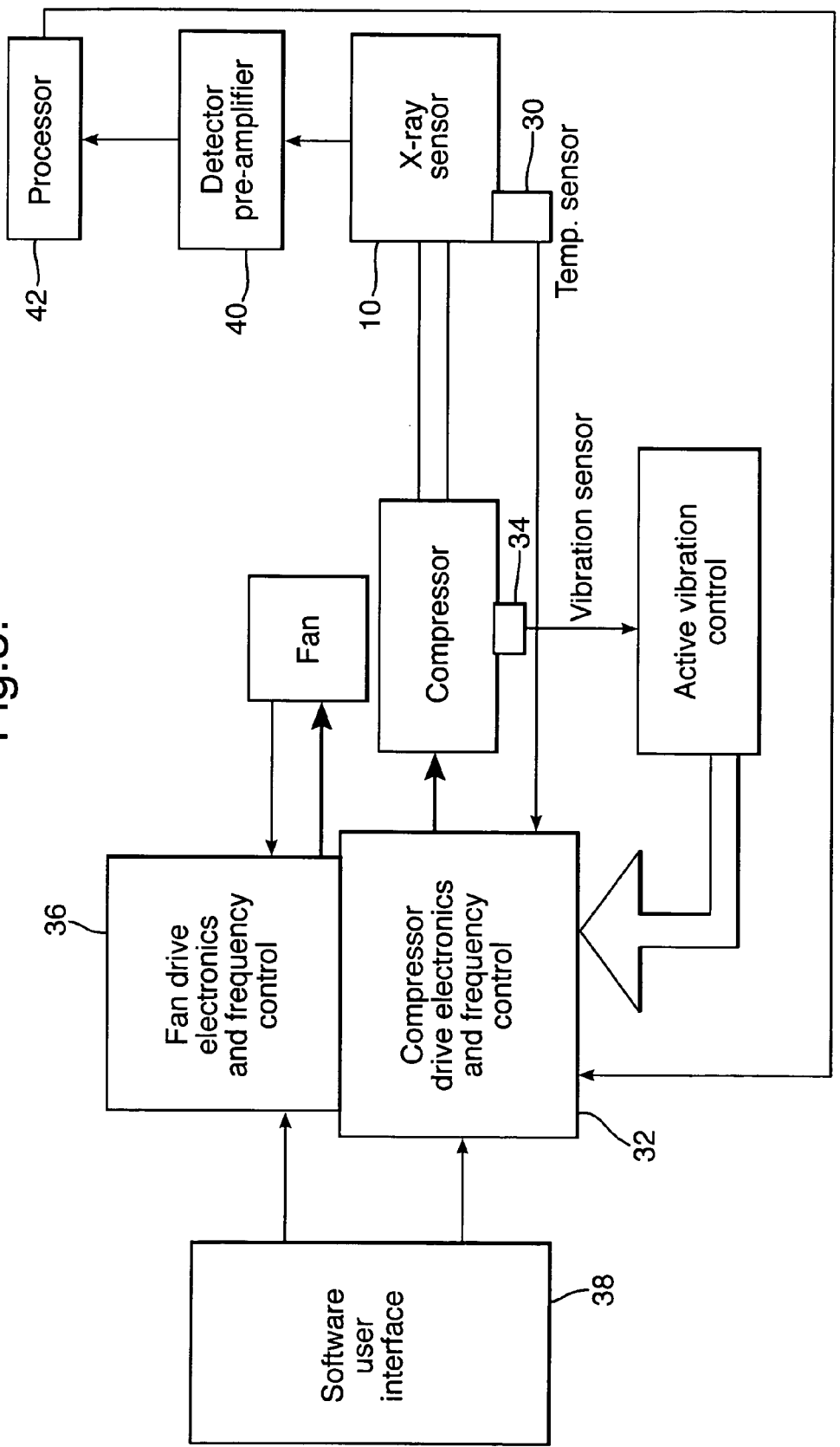
FIG. 3 is a block diagram showing the primary components of the cooling system used in the FIG. 2 instrument; and, FIGS. 4a and 4b illustrate the appearance of a sample when subject to vibration and when subject to less vibration respectively.

FIG. 3 illustrates in block diagram form the control system for controlling the fan and compressor. A temperature sensor 30 located near the transducer 10 monitors the temperature of the transducer 10 and this information is fed back to control electronics 32 which allows the cooling system 24 to maintain the temperature at the desired operating point.

In order to reduce vibration of the system, a vibration sensor 34 is mounted to the compressor 28 so as to feed back information concerning the vibration of the components of the instrument to an active vibration control system 33 which acts through the control electronics 32 to dampen the vibrations. In addition, the control electronics 32 is programmed to control the fan drive and compressor control circuits 36 so that the fan 26 and compressor 28 are caused to oscillate at frequencies offset from the previously determined resonant frequencies of the instrument.

It will be seen in FIG. 3 that in addition to this feedback control, the user interface 38 is provided to allow a user to control the frequency of operation of the fan 26 and compressor 28 in accordance with an example of the present invention.

As shown in FIG. 1, the microbeam instrument is more sensitive to vibration at frequencies near to resonances of the mechanical system. The response of the mechanical system is altered when an X-ray detector is added to the microbeam instrument or the sample stage of the instrument is loaded with a heavy sample. However, if the frequency response curve for a specific design of microbeam instrument loaded with a specific detector system and a typical sample has been measured, then it is possible to set the frequencies of vibrating components (e.g. cooling fan and compressor) within the X-ray detector system so that they avoid such resonances.

Figure 4A:
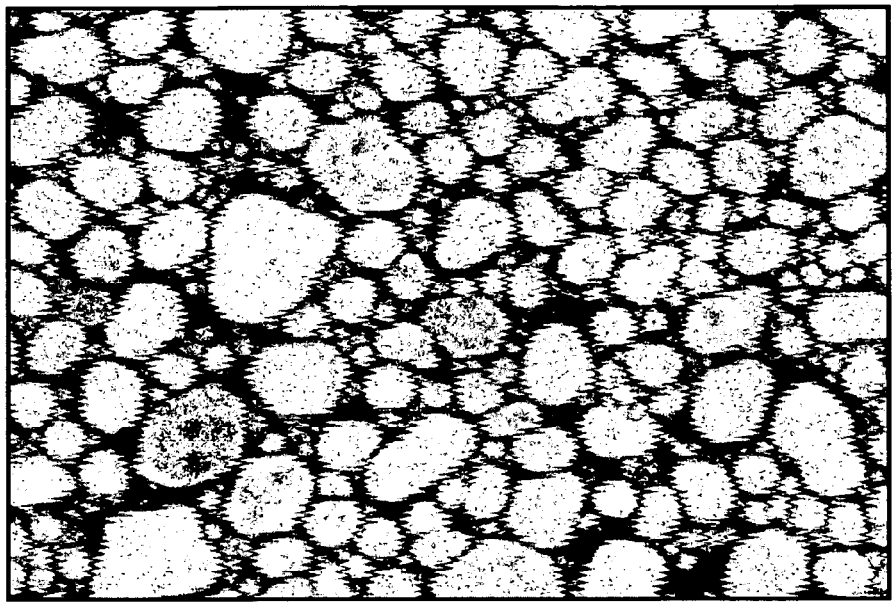
Figure 4B:
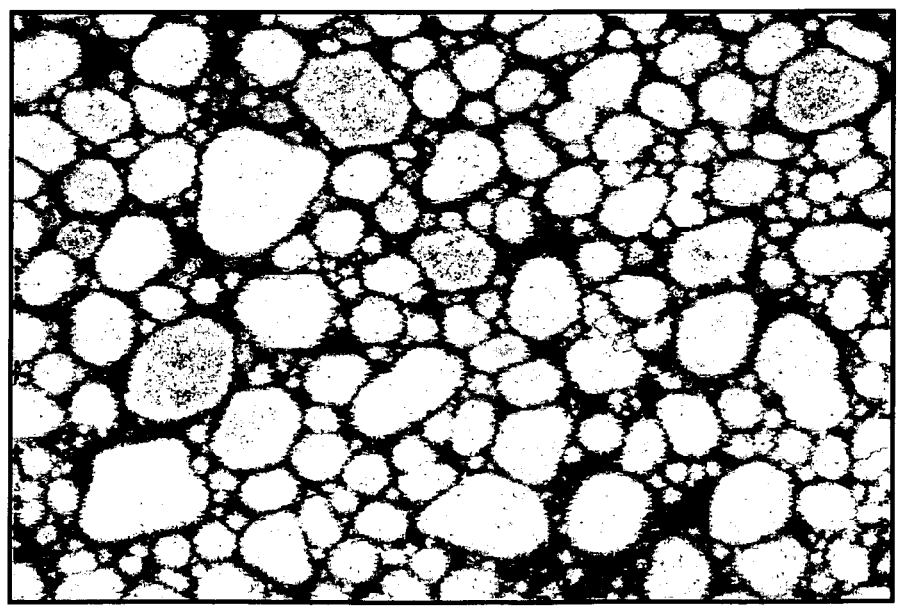

It is not always practical to obtain a comprehensive frequency response of the microbeam instrument and the following process can be followed to optimise performance on an unknown microbeam instrument. When the detector system is first constructed, it is fixed to a plate simulating a typical detector interface. An accelerometer is also fixed to the plate to measure vibrations induced by the fan and the compressor. The fan frequency range is scanned first to find and then fix the frequency giving the lowest level of vibration transferred to the plate and then the process is repeated for the compressor frequency. These values are then stored as factory defaults for the detector system. When the detector system is installed on the microbeam instrument, an image is recorded at high magnification using the default factory settings. A typical example is shown in FIG. 4(a) where individual grains in the image exhibit serrated edges because of the effects of vibration on the sample. The software user interface 38 (FIG. 3) offers the user a choice of a number of preset settings for fan and compressor frequencies. By selecting each option in turn and collecting a high resolution image for that setting, the user can determine, by manual inspection of the images, the optimum setting to reduce the effects of vibration on the image and this choice of settings is saved for future use. An improved image showing less vibration distortion is shown in FIG. 4(b).

When the configuration of the microbeam instrument is altered, for example by adding another instrument on to another port on the microbeam instrument housing (FIG. 2) or the sample stage is loaded with a heavy sample, the resonances of the microbeam instrument may change. In the case that this makes vibration worse, the user can select a different option for the frequency settings of fan and compressor.

A further improvement is possible when the computer 42 can record a digitised high resolution image from the microbeam instrument. In this case, a digital image is recorded with the X-ray detector system switched on. Another image is then recorded with all vibrating components of the X-ray detector system switched off. The digitised images can then be compared by a comparator, usually part of the processor 42, to measure the effective distortion introduced by the detector. This comparison can involve scaling the images to the same brightness and subtracting to find the sum of the squared residuals. Alternatively, if it is important to minimise a specific type of distortion or maximise spatial resolution, alternative methods can be used such as measuring the power spectrum in both images using a spatial Fourier transform method that is commonly used to measure resolution in electron microscopes. The measure of distortion obtained for one particular setting of the X-ray detector system frequencies can then be reported to the user via the software user interface to make it easier to select the optimum setting.

It is advantageous to avoid any user intervention when choosing the best setting. If the computer 42, that controls the X-ray detector system, can also acquire digital images, then the measure of distortion produced by different frequency settings for the X-ray detector system can be obtained under automated control. In this case, rather than a few selected presets, a series of frequencies can be explored to discover any resonances and the X-ray detector system frequencies can then be tuned to avoid such resonances and minimise the deleterious effects on the resolving power of the microbeam instrument.

We claim:

1. A sample inspection apparatus comprising a sample support; a detection system for detecting radiation or particles emitted by or transmitted through a sample on the sample support in response to radiation incident on the sample; and a cooling system for cooling at least one of the sample support and detection system, the cooling system including at least one oscillating, mechanical component which oscillates at a frequency different from the at least one of the support and detection system.

2. Apparatus according to claim 1, wherein the oscillating mechanical component comprises a cooling fan or pump.

3. Apparatus according to claim 1, wherein the oscillating mechanical component comprises a piston or rotating component, such as a fan blade or pressure control valve.

4. Apparatus according to claim 1, wherein the cooling system comprises a mechanical, cryo-free refrigerator.

5. Apparatus according to claim 4, wherein the refrigerator is one of a pulse tube, Gifford-McMahon, Stirling, Joule-Thomson, Linde-Hampson, Turbo-Brayton, or Thermoacoustic refrigerator.

6. Apparatus according to claim 1, further comprising a controller for controlling the frequency of oscillation of the at least one oscillating mechanical component.

7. Apparatus according to claim 6, wherein the controller is manually operable.

8. Apparatus according to claim 7, wherein the controller is adapted to operate the oscillating mechanical component at a selected one of a number of predefined frequencies.

9. Apparatus according to claim 1, further comprising an imaging system for obtaining an image of a sample from radiation or particles detected by the detection system from different pixels of the sample; a comparator for comparing images obtained using one or more oscillation frequencies, with an image obtained without oscillating the at least one mechanical component, and for determining which has the least distortion due to vibration effects; and a controller responsive to the comparator for subsequently controlling the frequency of oscillation of the at least one oscillating mechanical component in accordance with the frequency associated with the determined image.

10. Apparatus according to claim 1, wherein the detection system includes an X-ray detector for detecting X-rays emitted by a sample on the sample support.

11. Apparatus according to claim 10, further comprising a source of stimulating radiation and a system for guiding said stimulating radiation to the sample so as to stimulate X-ray emission from the sample.

12. Apparatus according to claim 11, wherein said source generates one of electrons, X-rays and ions.

13. Apparatus according to claim 1, the apparatus comprising one of a scanning electron microscope, transmission electron microscope, scanning transmission electron microscope, electron probe microanalyser and defect review tool.

14. Apparatus according to claim 1, wherein the detection system includes an optical detector.

15. Apparatus according to claim 14, wherein the apparatus is a microscope.

16. Apparatus according to claim 15, wherein the microscope is a confocal optical microscope or scanning probe microscope.

17. A method of determining a suitable operating frequency of an oscillating mechanical component of a sample inspection apparatus according to claim 1, the method comprising:
  i) obtaining images of a sample from radiation or particles detected from different points of the sample using one or more oscillation frequencies;
  ii) comparing the image(s) obtained with an image obtained without oscillating the at least one mechanical component and determining which has the least distortion due to vibration effects; and
  iii) subsequently controlling the frequency of oscillation of the at least one oscillating mechanical component in accordance with the frequency associated with the determined image.

18. A method according to claim 17, wherein the at least one oscillating mechanical component is controlled to oscillate at substantially the same frequency as that used when obtaining the determined image.

* * * * *